(12) United States Patent
Kanamori et al.

(10) Patent No.: US 8,035,215 B2
(45) Date of Patent: Oct. 11, 2011

(54) SEMICONDUCTOR DEVICE AND MANUFACTURING METHOD OF THE SAME

(75) Inventors: Hiroshi Kanamori, Tokyo (JP); Shigeki Otsuka, Chiba (JP); Yuichi Morita, Gunma (JP); Akira Suzuki, Gunma (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 379 days.

(21) Appl. No.: 11/340,851

(22) Filed: Jan. 27, 2006

(65) Prior Publication Data

US 2006/0180933 A1    Aug. 17, 2006

(30) Foreign Application Priority Data

Jan. 31, 2005   (JP) ................... 2005-022525

(51) Int. Cl.
*H01L 23/48*    (2006.01)
(52) U.S. Cl. . 257/698; 257/773; 257/774; 257/E23.141; 438/667
(58) Field of Classification Search .............. 257/774, 257/E23.141, 698, 773; 438/667
See application file for complete search history.

(56) References Cited

U.S. PATENT DOCUMENTS

| | | | | |
|---|---|---|---|---|
| 4,051,550 | A | * | 9/1977 | Seno et al. .............. 361/765 |
| 5,899,740 | A | * | 5/1999 | Kwon .................... 438/627 |
| 6,052,287 | A | * | 4/2000 | Palmer et al. ............ 361/767 |
| 6,221,751 | B1 | * | 4/2001 | Chen et al. .............. 438/612 |
| 6,617,681 | B1 | * | 9/2003 | Bohr .................... 257/700 |
| 7,061,015 | B2 | | 6/2006 | Kim et al. |
| 7,102,238 | B2 | * | 9/2006 | Noma et al. ............. 257/777 |
| 2003/0119308 | A1 | | 6/2003 | Geefay et al. |
| 2004/0155354 | A1 | | 8/2004 | Hanaoka et al. |
| 2004/0212086 | A1 | | 10/2004 | Dotta et al. |

FOREIGN PATENT DOCUMENTS

| | | |
|---|---|---|
| EP | 1 471 571 | 10/2004 |
| JP | 8-181088 | 7/1996 |
| JP | 2002-512436 A1 | 4/2002 |
| JP | 2004-080006 | 3/2004 |
| JP | 2005-19521 | 1/2005 |
| JP | 2005-019522 | 1/2005 |
| WO | WO-99/40624 | 8/1999 |
| WO | WO-03/043094 | 5/2003 |

OTHER PUBLICATIONS

EP Search Report mailed on Apr. 6, 2010 directed at counterpart application No. 06001902.3; 6 pages.

* cited by examiner

*Primary Examiner* — Kenneth Parker
*Assistant Examiner* — John Lin
(74) *Attorney, Agent, or Firm* — Morrison & Foerster, LLP (57) ABSTRACT

The invention is directed to prevent corrosion of a semiconductor device. In the semiconductor device manufacturing method of the invention, a semiconductor substrate is etched from its back surface in a position corresponding to a first wiring formed on the semiconductor substrate with a first insulation film therebetween, to form a first opening exposing the first insulation film. Next, the insulation film exposed in the first opening is etched to form a second opening exposing the first wiring, and then the semiconductor substrate is etched to increase a diameter of the first opening and form a first opening having the larger diameter. Then, a second insulation film is formed on the back surface of the semiconductor substrate including on the first wiring through the first and second openings, and then the second insulation film covering the first wiring is etched.

10 Claims, 8 Drawing Sheets

SEMICONDUCTOR DEVICE AND MANUFACTURING METHOD OF THE SAME

CROSS-REFERENCE OF THE INVENTION

This invention is based on Japanese Patent Application No. 2005-022525, the content of which is incorporated by reference in its entirety.

BACKGROUND OF THE INVENTION

1. Field of the Invention

The invention relates to a technology for enhancing a yield and reliability of a semiconductor device.

2. Description of the Related Art

CSP (Chip Size Package) has received attention in recent years as a packaging technology. The CSP means a small package having almost the same outside dimensions as those of a semiconductor die packaged in it. Conventionally, BGA (ball grid array) type semiconductor devices have been known as a kind of CSP. In this BGA type semiconductor device, a plurality of ball-shaped conductive terminals made of metal such as solder is arrayed in a grid pattern on one surface of the package, and electrically connected with the semiconductor die mounted on the other side of the package.

When this BGA type semiconductor device is mounted on electronic equipment, the semiconductor die is electrically connected with an external circuit on a printed circuit board by compression bonding of the ball-shaped conductive terminals to wiring patterns on the printed circuit board.

Such a BGA type semiconductor device has advantages in providing a large number of conductive terminals and in reducing size over other CSP type semiconductor devices such as SOP (Small Outline Package) and QFP (Quad Flat Package), which have lead pins protruding from their sides. The BGA type semiconductor device is used as an image sensor chip for a digital camera incorporated into a mobile telephone, for example.

Figure 10A:
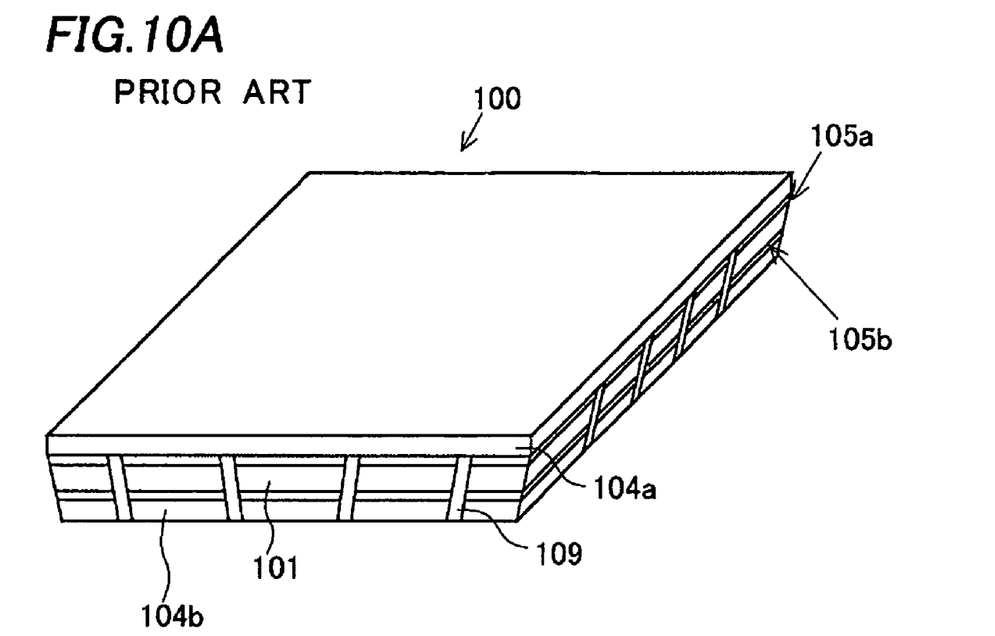
FIGS. 10A and 10B are oblique perspective figures of a conventional semiconductor device.
Figure 10B:
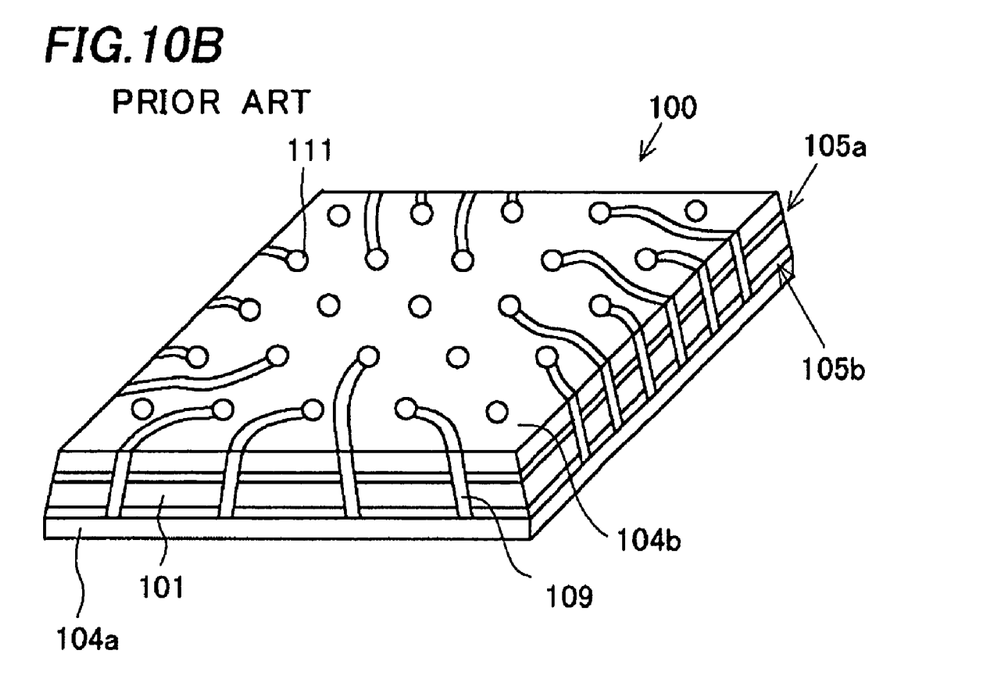

FIGS. 10A and 10B show an outline structure of the conventional BGA type semiconductor device. FIG. 10A is an oblique perspective figure showing a front side of the BGA type semiconductor device. FIG. 10B is an oblique perspective figure showing a back side of the BGA type semiconductor device.

A semiconductor die 101 is sealed between a first glass substrate 104a and a second glass substrate 104b with resin 105a and 105b therebetween in the BGA type semiconductor device 100. A plurality of ball-shaped terminals (referred to as conductive terminals 111, hereafter) is arrayed in a grid pattern on one surface of the second glass substrate 104b, that is, on the back surface of the BGA type semiconductor device 100. The conductive terminals 111 are connected to the semiconductor die 101 through a plurality of second wirings 109. The plurality of second wirings 109 is connected with aluminum wirings pulled out from inside of the semiconductor die 101, making each of the conductive terminals 111 electrically connected with the semiconductor die 101.

Figure 11:
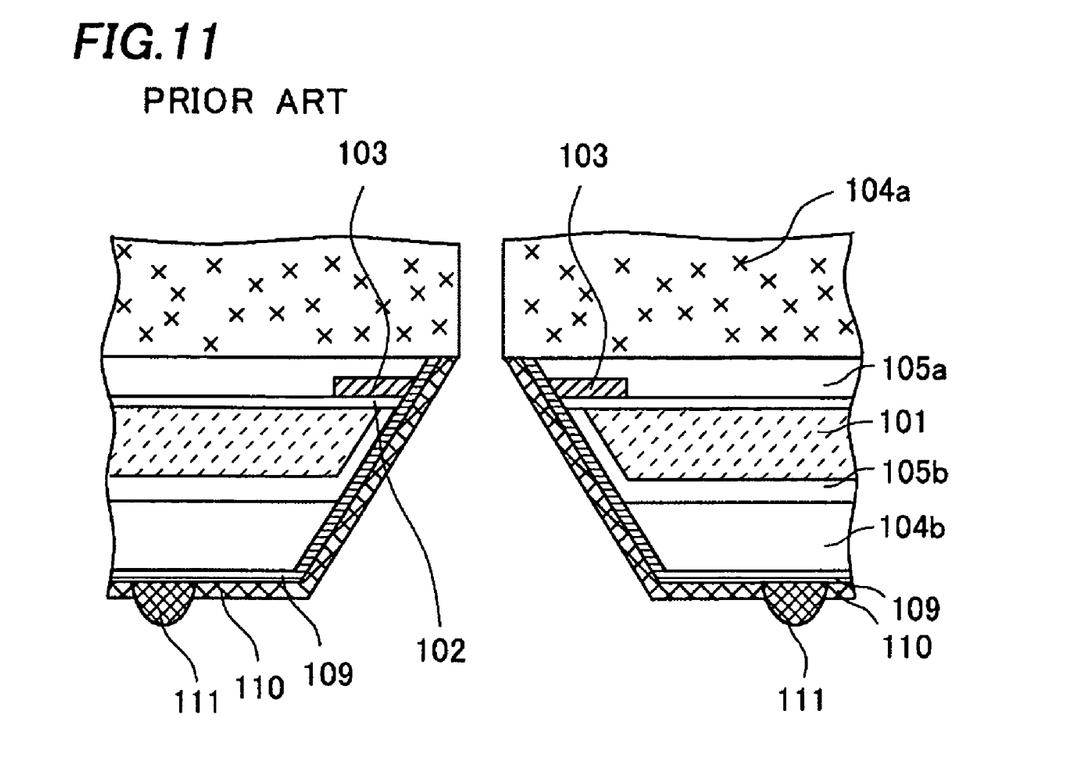
FIGS. 11 to 14 are cross-sectional views showing a conventional semiconductor device manufacturing method.

More detailed explanation on the cross-sectional structure of the BGA type semiconductor device 100 will be given hereafter referring to FIG. 11. FIG. 11 shows a cross-sectional view of the BGA type semiconductor devices 100 separated into individual dies along borders (called scribe lines or dicing lines).

A first wiring 103 is provided on an insulation film 102 on the front surface of the semiconductor die 101, as shown in FIG. 11. The semiconductor die 101 is attached to the first glass substrate 104a with the resin 105a. A back surface of the semiconductor die 101 is attached to the second glass substrate 104b with the resin 105b. One end of the first wiring 103 is connected to the second wiring 109. The second wiring 109 extends from the end of the first wiring 103 onto a surface of the second glass substrate 104b. The ball-shaped conductive terminal 111 is formed on the second wiring 109 extended onto the second glass substrate 104b. The technology mentioned above is disclosed in the Japanese Patent Application Publication No. 2002-512436.

A technology of not using the second glass substrate on the back surface of the semiconductor wafer is disclosed in the Japanese Patent Application Publication No. 2004-80006 by the inventors of this invention.

Explanation on a BGA-type semiconductor device manufacturing method will be given particularly for a case that a sheet of supporting body is attached to a semiconductor die, with reference to figures.

Figure 12:
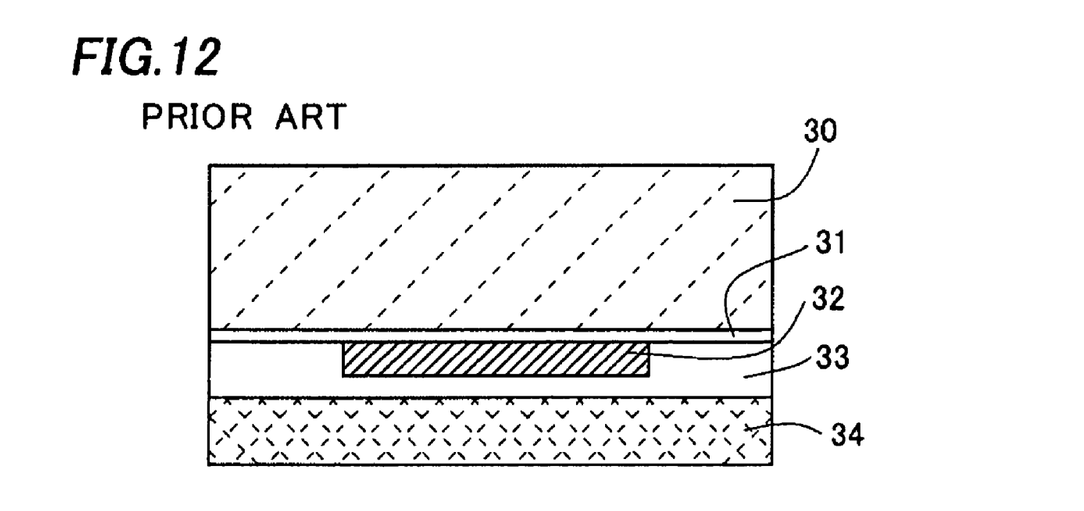
Figure 13:
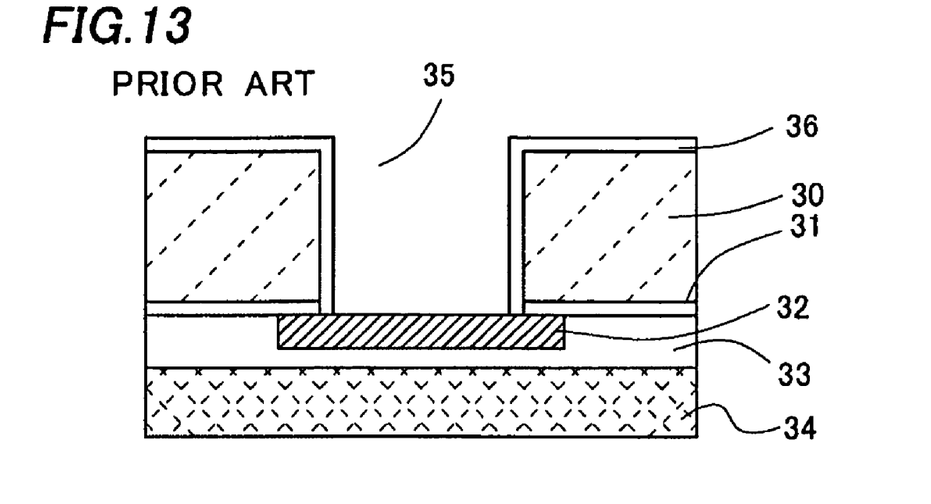
Figure 14:
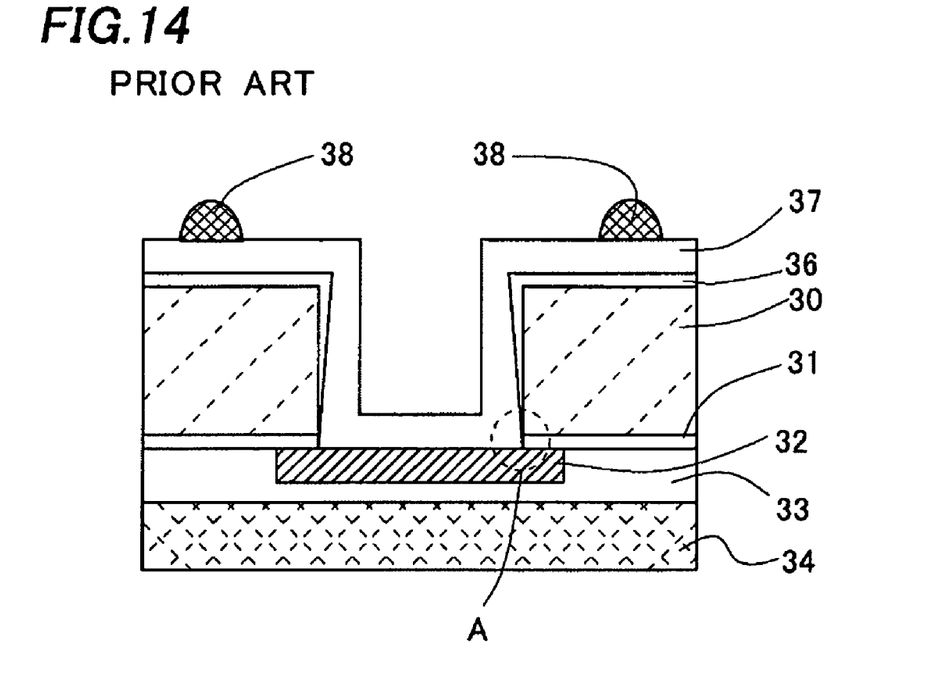

FIGS. 12 to 14 are cross-sectional views showing a conventional BGA-type semiconductor device manufacturing method applicable to an image sensor chip.

First, as shown in FIG. 12, a first wiring 32 formed of an aluminum layer or an aluminum alloy layer is formed on a front surface of a semiconductor substrate 30 with a first insulation film 31 formed of a silicon oxide film, a silicon nitride film, or the like therebetween. Then, a glass substrate 34 is attached to the semiconductor substrate 30 including the first wiring 32 with an adhesive 33 formed of epoxy resin therebetween, for example.

Next, as shown in FIG. 13, a resist film (not shown) is formed on the back surface of the semiconductor substrate 30, having an opening in a position corresponding to the first wiring 32. Then, dry-etching is performed to the semiconductor substrate 30 using the resist film as a mask, and further the insulation film 31 is etched to form an opening 35 from the back surface of the semiconductor substrate 30 to the first wiring 32.

Then, a second insulation film 36 is formed on the back surface of the semiconductor substrate 30 including in the opening 35, and the second insulation film 36 is etched to expose a front surface of the first wiring 32. Then, as shown in FIG. 14, a wiring layer 37 connected with the first wiring 32 is formed with the second insulation film 36 therebetween. Furthermore, a protection layer (not shown) is formed on the wiring layer 37, and an opening is provided in a predetermined position of the protection layer and a ball-shaped terminal 38 contacting the wiring layer 37 is formed.

Although not shown, the semiconductor substrate and the layers layered thereon are then cut into individual semiconductor dies. Thus, the BGA-type semiconductor device where the first wiring 32 and the ball-shaped terminal 38 are electrically connected with each other is formed.

However, during the described manufacturing process of the semiconductor device, the thickness of the second insulation film 36 becomes small as shown in FIG. 14, depending on the state of depositing the second insulation film 36 or the state of etching the second insulation film 36 in order to expose the front surface of the first wiring 32 after the deposition of the second insulation film 36, for example. This causes problems of reducing dielectric strength, or infiltrating treatment chemicals and the like into the semiconductor device from a silicon end portion through the opening 35 to corrode the first wiring 32. Particularly, the thickness of the deposited insulation film on the bottom portion and sidewall portion of the opening 35 tends to be smaller than on the back surface of the semiconductor substrate 30 as shown in FIG.

14, so that the portion designated as A may be covered insufficiently. This can reduce resistance to moisture infiltration after manufacturing.

SUMMARY OF THE INVENTION

The invention provides a semiconductor device that includes a semiconductor substrate having a hole penetrating through its thickness. The hole has a first end at the back surface of the substrate and a second end at the front surface of the substrate. The device also includes a first insulation film disposed on the front surface and having an opening overlapping with the hole of the substrate. This opening of the first insulation film is smaller than the second end of the hole. The device also includes a first wiring disposed on the first insulation film so as to cover the opening of the first insulation film, a second insulation film disposed on a sidewall of the hole of the substrate and the back surface of the substrate, and a second wiring disposed in the hole so as to be in contact with the first wiring, the first insulation film and the second insulation film.

The invention also provides a method of manufacturing a semiconductor device. The method includes providing a semiconductor substrate having a first insulation film formed on its front surface and a first wiring formed on the first insulation film, etching the semiconductor substrate from its back surface to expose part of the first insulation film that corresponds to the first wiring, etching the exposed first insulation film to expose part of the first wiring, etching, after the exposure of the first wiring, the semiconductor substrate to expose an additional part of the first insulation film, forming a second insulation film to cover a sidewall of the semiconductor substrate that is formed by the etchings and to cover the back surface of the semiconductor substrate, and forming a second wiring that is on the second insulation film and is connected with the first wiring.

DETAILED DESCRIPTION OF THE INVENTION

A semiconductor device and its manufacturing method of the invention will be described with reference to FIGS. 1 to 9.

FIGS. 1 to 9 are cross-sectional views showing a method of manufacturing a BGA-type semiconductor device applicable to an image sensor chip.

Figure 1:
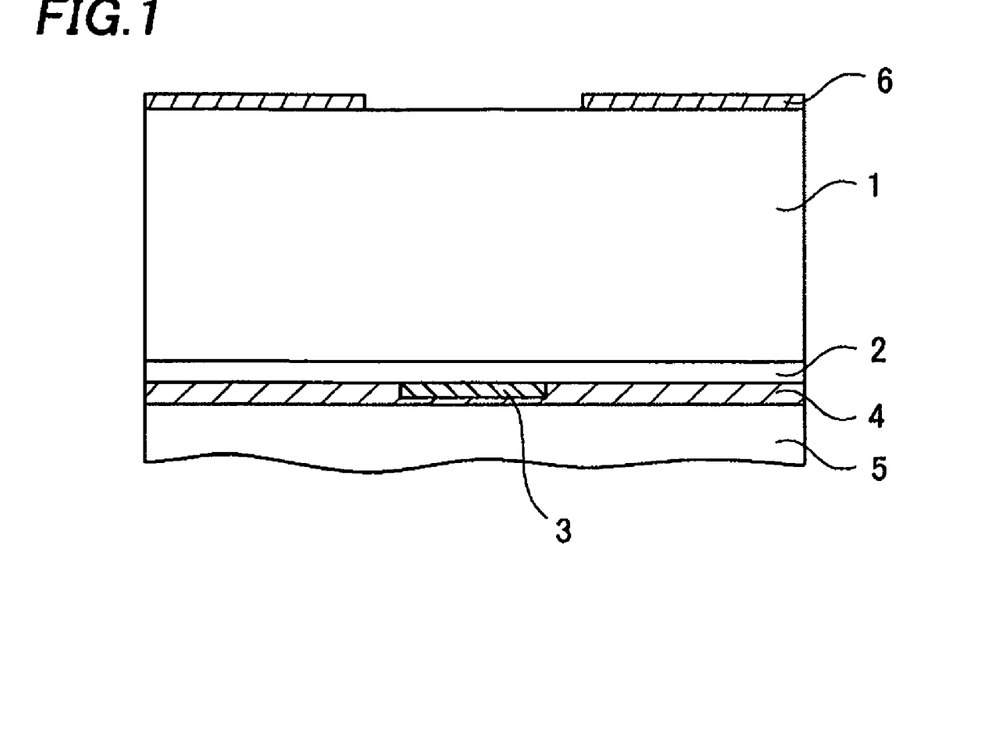
FIGS. 1-8A are cross-sectional views showing a semiconductor device manufacturing method of an embodiment of the invention.

First, a semiconductor substrate 1 formed of a semiconductor wafer formed of, for example, silicon is prepared as shown in FIG. 1. This semiconductor substrate 1 has a device such as a CCD image sensor or a semiconductor memory formed by semiconductor processes. A first wiring 3 formed of aluminum, aluminum alloy, or copper is formed on a front surface of the semiconductor substrate 1 with a first insulation film 2 formed of, for example, a silicon oxide film or a silicon nitride film therebetween. The first wiring 3 is a pad electrode for external connection, being electrically connected with a circuit (not shown) of the semiconductor device. A passivation film formed of, for example, a silicon oxide film or a silicon nitride film covers the semiconductor substrate 1 including the first wiring 3.

Then, a supporting body 5 formed of, for example, a glass substrate, ceramic, quartz, plastic, resin (e.g. resist or epoxy resin), or the like is attached to the semiconductor substrate 1 including the first wiring 3 with a transparent adhesive 4 formed of epoxy resin or the like therebetween. The adhesive 4 is not necessarily transparent and resist resin, acrylic resin, or the like can be used as the adhesive 4 regardless transparent or opaque unless the device is the image sensor.

Figure 2:
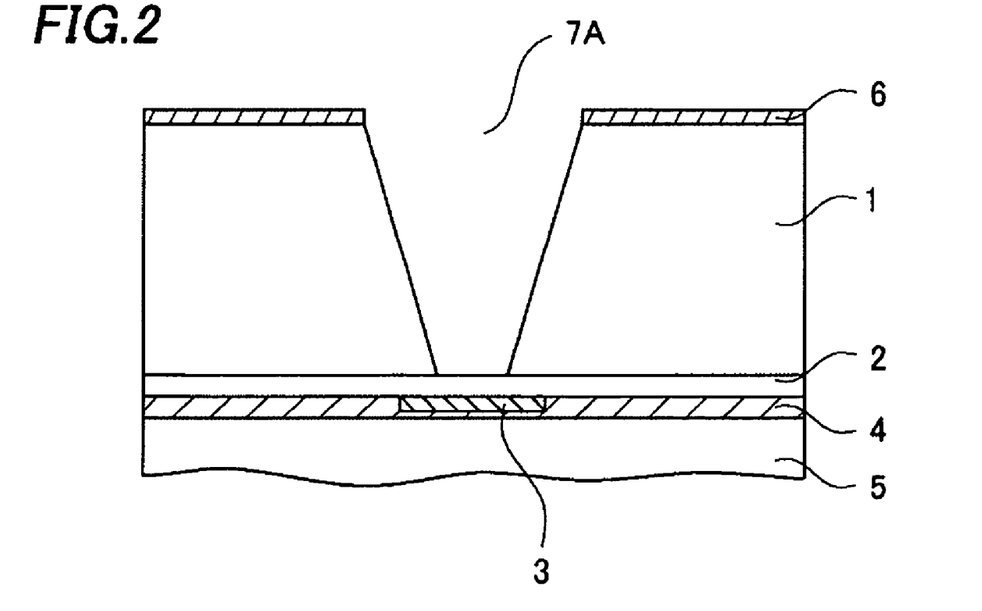

Next, a first resist film 6 is formed on the back surface of the semiconductor substrate 1, having an opening in a position corresponding to the first wiring 3, and the semiconductor substrate 1 is dry-etched using the resist film 6 as a mask to form a first opening 7A exposing the first insulation film 2 from the back side of the semiconductor substrate 1, as shown in FIG. 2.

Figure 3:
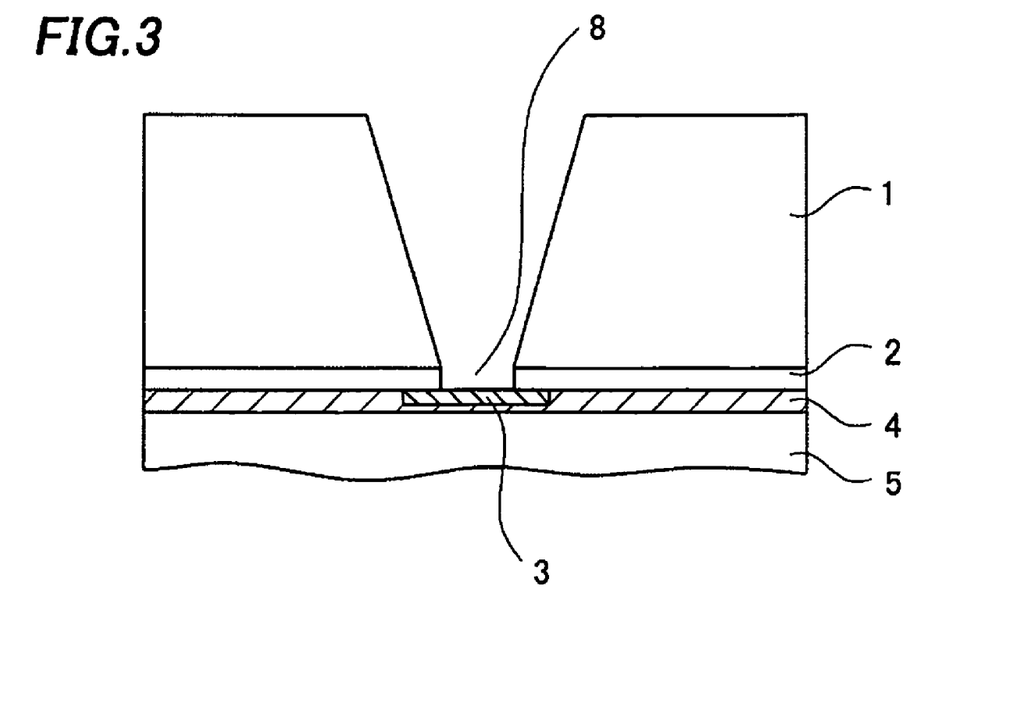

Then, after the resist film 6 is removed, the insulation film 2 exposed in the first opening 7A is etched to form a second opening 8 exposing a surface of the first wiring 3, as shown in FIG. 3. It is also possible to remove the resist film 6 after the second opening 8 is formed.

Figure 4:
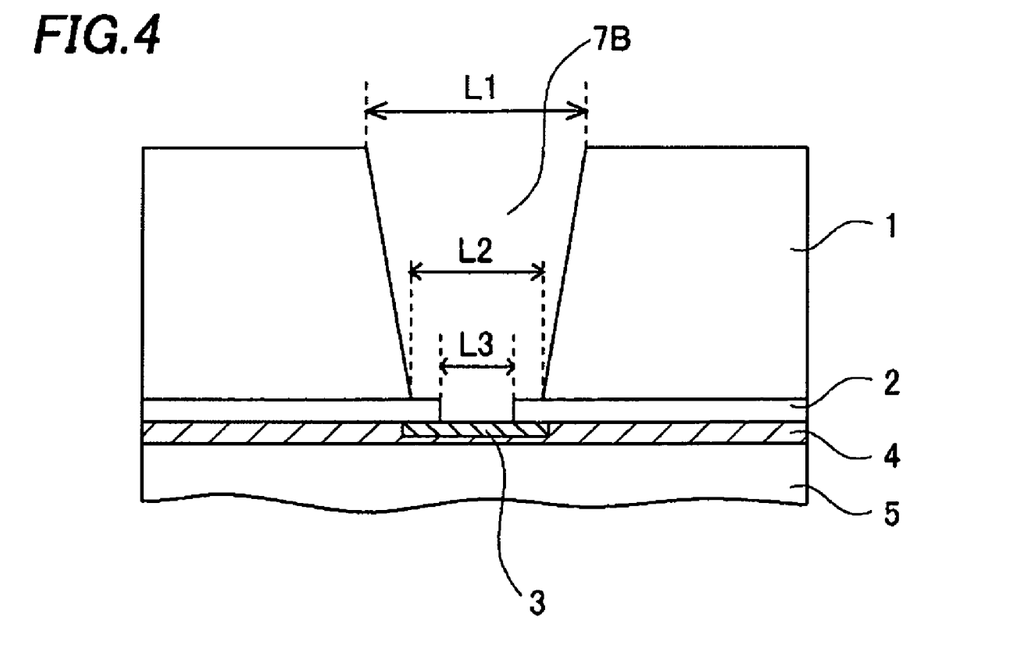

Next, the semiconductor substrate 1 is etched to increase a diameter of the first opening 7A and form a first opening 7B having the larger diameter, as shown in FIG. 4. In this embodiment, an upper diameter L1 and a bottom diameter L2 of the first opening 7B are about 150 μm and 60 μm, respectively, and a diameter L3 of the second opening 8 is about 30 μm.

Figure 5:
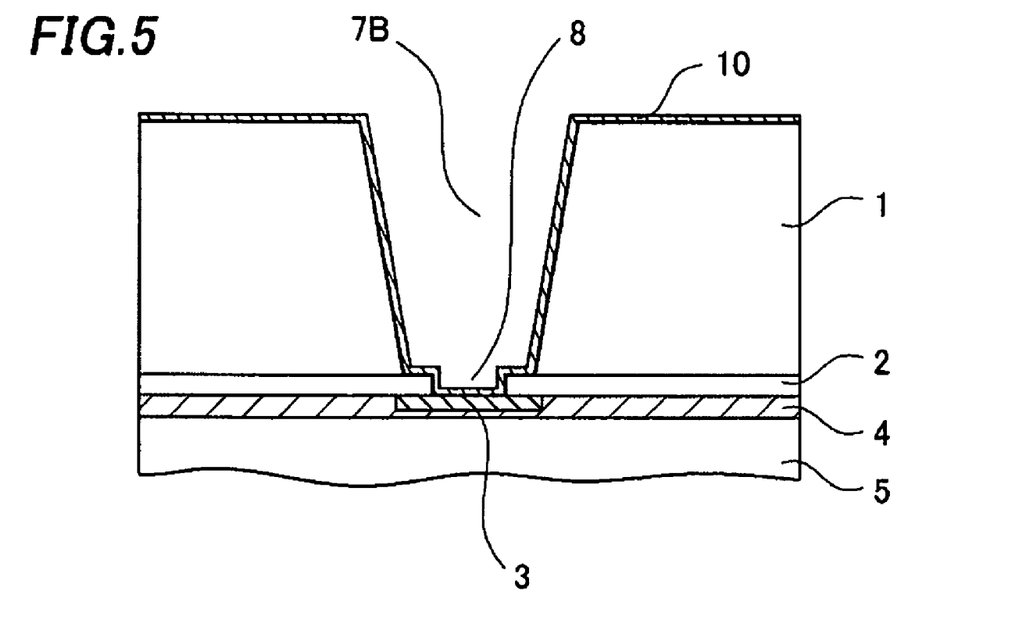

Next, a second insulation film 10 is formed on the back surface of the semiconductor substrate 1 including on the first wiring 3 through the first and second openings 7B and 8, as shown in FIG. 5. In this embodiment, an inorganic insulation film is formed as the second insulation film 10. As this inorganic insulation film, a TEOS film is formed by a low-temperature CVD (Chemical Vapor Deposition) method, for example. Generally, the inorganic insulation film has high covering properties and can achieve a stable covering form even in a three-dimensional structure. The insulation film formed in this process is not limited to the inorganic insulation film, and it is also possible to form an organic insulation film formed of, for example, epoxy resin. Generally, the organic insulation film is smooth in its surface, and thus effective for enhancing covering properties of a metal film (a second wiring 12 described below) to be deposited thereon.

Figure 6:
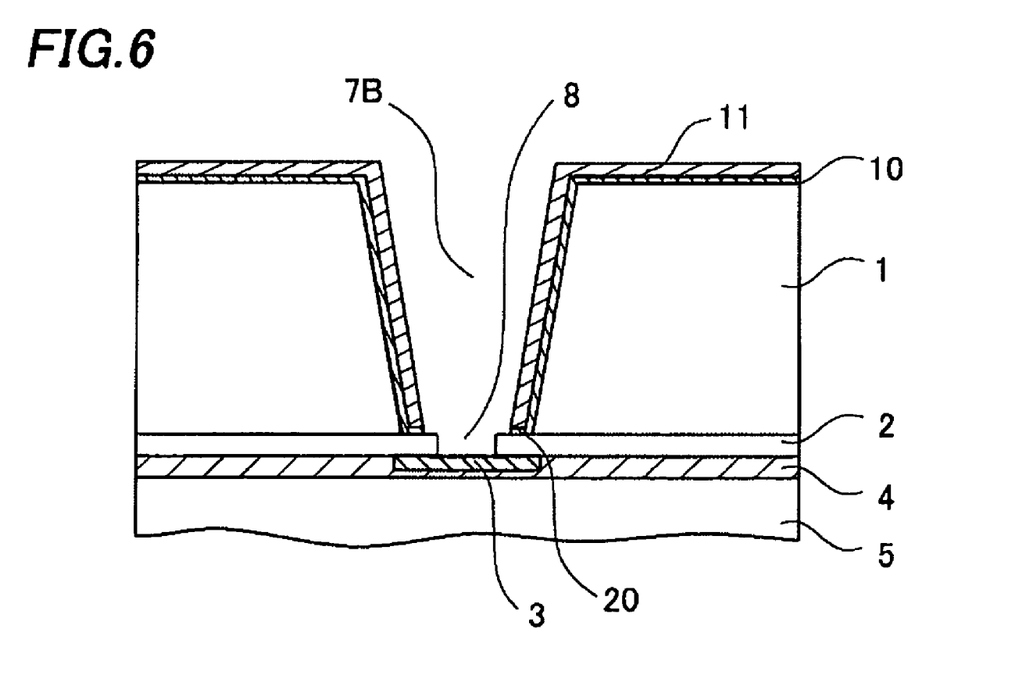

Next, as shown in FIG. 6, the second insulation film 10 covering the first wiring 3 is etched using the second resist film 11 formed on the back surface of the semiconductor substrate 1 as a mask to expose the first wiring 3.

Figure 9:
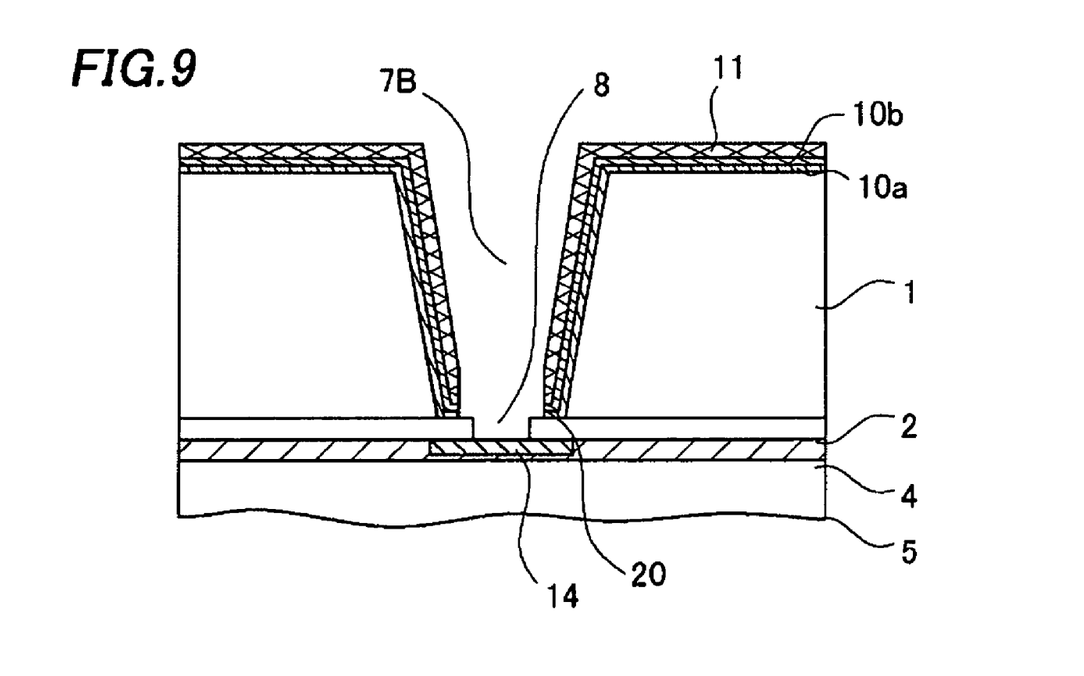
FIG. 9 is a cross-sectional view showing a semiconductor device manufacturing method of another embodiment of the invention.

FIG. 9 shows a modification of this embodiment. This drawing shows a device intermediate corresponding to that of FIG. 6 of this embodiment. In this modification, the inorganic insulation film 10a is first formed, the organic insulation film 10b is then formed, and these layered films are etched to expose the first wiring 14, as shown in FIG. 9. By this process, the described advantages of the inorganic insulation film and the organic insulation film can be provided, and this layered structure can enhance dielectric strength.

In the process of etching the second insulation film 10 or the combination of the inorganic insulation film 10a and the organic insulation film 10b, the resist film 11 is used as a mask in this embodiment. However, the etching process can be performed by utilizing differences in thickness of the insulation films 10, 10a and 10b deposited on the bottom portion and the sidewall portion of the first and second openings 7B and 8 and on the back surface of the semiconductor substrate 1, without using the resist film as a mask. That is, the thicknesses of the insulation films 10, 10a and 10b are larger on the back surface of the semiconductor substrate 1 and reduces gradually toward the bottom portion of the hole. Therefore, using this tendency, when the insulation films 10, 10a and 10b deposited on the bottom portion are removed to expose the first wiring 3, the insulation films 10, 10a, and 10b deposited on the sidewall portion and on the back surface of the semiconductor substrate 1 still remain. Thus, the etching can be performed without a mask, and the process can be rationalized.

In the embodiment, the semiconductor substrate 1 and the first insulation film 2 are etched to form the first and second openings 7A and 8 exposing the first wiring 3, and then the semiconductor substrate 1 is etched to increase the diameter of the first opening 7A and form the first opening 7B having the larger diameter. By these processes, the end portion of the second insulation films 10, 10a, and 10b after the second insulation films 10, 10a, and 10b formed in the first and second openings 7B and 8 are patterned forms a protrusion portion protruding in an inner direction of the first opening 7B from the end portion of the front surface of the semiconductor substrate 1. In other words, part of the second insulation film 10 is disposed on the first insulation film 2 that is exposed in the process step shown in FIG. 4 and extends toward the center of the opening 8. FIG. 6 shows this portion of the second insulation film 10 by referring to reference numeral 20.

Thus, the second insulation film lies at least on the first insulation film 2 as shown in FIG. 6, thereby preventing problems of reduction of dielectric strength due to the insufficient covering for the insulation film as has been seen in the conventional art. The prevents the corrosion of the first wiring 3 and the like caused by infiltration of chemicals and the like from the silicon end portion during the manufacturing process or infiltration of moisture and the like after the manufacturing process.

Figure 7:
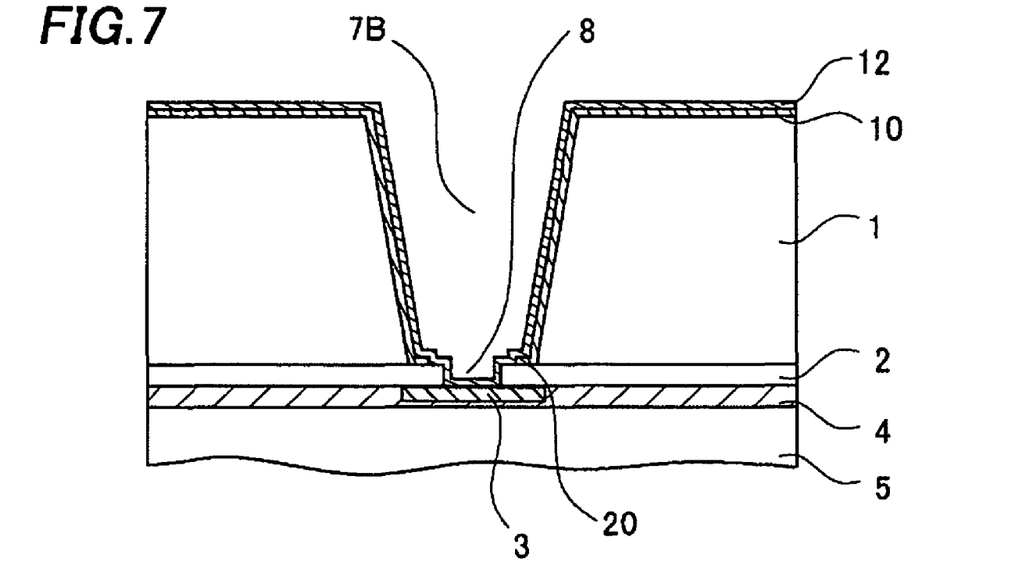

Going back to the explanation of the process flow, after the resist film 11 is removed, a second wiring 12 electrically connected with the first wiring 3 is formed in the first and second openings 7B and 8 with the second insulation film 10 therebetween as shown in FIG. 7. In this embodiment, aluminum, aluminum alloy, or the like are deposited as the second wiring 12 by a sputtering method, for example. Alternatively, copper or the like is deposited by a plating method. Furthermore, although omitted in the figure, a barrier film formed of a titanium nitride (TiN) film is formed under the second wiring 12. Metal having a high melting point (refractory metal) such as a titanium (Ti) film or a tantalum (Ta) film, compounds of such metal such as a titanium tungsten (TiW) film, a tantalum nitride (TaN) film, or a layered film of these metal films can be deposited as the barrier film. In the case of forming a plating film of copper, a seed film for plating (e.g. copper) is formed on the barrier film, and plating is performed on the seed film to form a wiring layer formed of copper. The wiring layer may be patterned or not be patterned.

Figure 8:
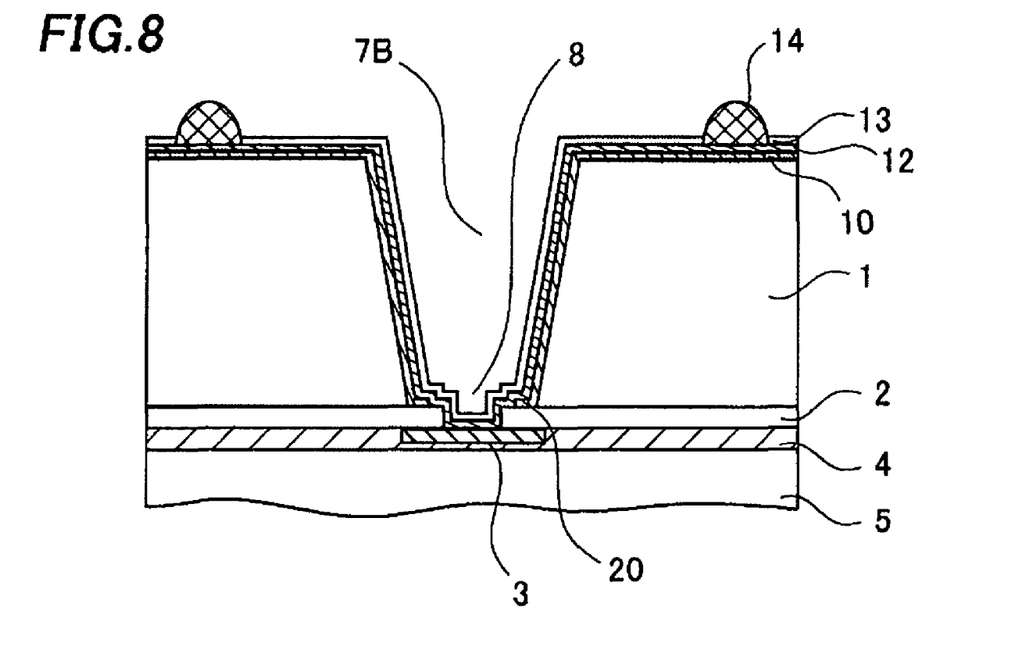

Then, as shown in FIG. 8, a protection film 13 is formed on the second wiring 12, openings are provided in a predetermined position of the protection film 13, and ball-shaped terminals 14 contacting the second wiring 12 are formed. It is possible that the second wiring 12 is formed only in the first and second openings 7B and 8 so as not to extend onto the back surface of the semiconductor substrate 1, and the second wiring 12 and the ball-shaped terminal 14 are connected in the first and second openings 7B and 8.

Then, although omitted in the figure, the semiconductor substrate and the layers layered thereon are cut into individual semiconductor dies. The BGA-type semiconductor device where the first wiring 3 and the ball-shaped terminal 14 are electrically connected with each other is thus formed.

Although this embodiment is described as applied to the semiconductor device formed with the ball-shaped terminal 14, the structure of the embodiment can be applied to the semiconductor device without the ball-shaped terminal as long as an opening penetrating the semiconductor substrate is formed, for example, to a LGA (Land Grid Array) type semiconductor device.

Figure 8A:
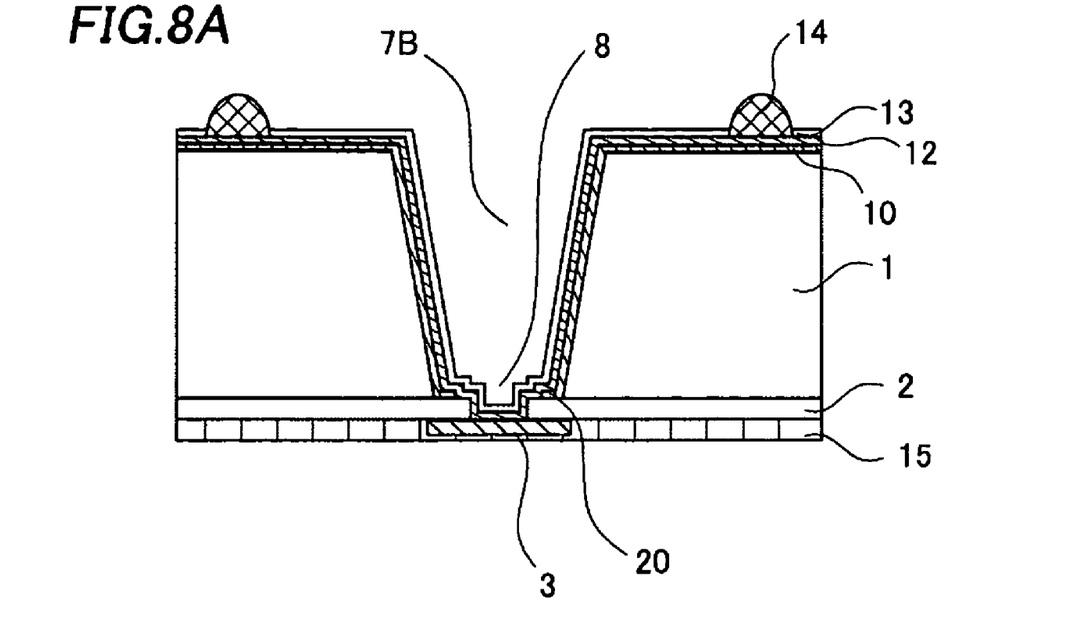

Although the supporting body 5 is attached to the front surface of the semiconductor substrate 1 in the described embodiment, this embodiment may be modified to include a semiconductor device without the supporting body 5 and a manufacturing method thereof as shown in FIG. 8A. In FIG. 8A, a protection film 15 formed of an insulator (e.g. a passivation film or a film layered with a passivation film and resin such as polyimide) covers the semiconductor substrate 1 including the first wiring 3. Although the protection film 15 in FIG. 8A completely covers the first wiring 3, it is possible that the protection film 15 covers only a part of the first wiring 3 to expose other of the first wiring 3. This enables wire-bonding or formation of a bump electrode on the exposed first wiring 3, or connection of the first wiring 3 to a conductive terminal of the other semiconductor device when the semiconductor device is to be layered on the other semiconductor device. Furthermore, it is also possible that the supporting body 5 is not used in the semiconductor device and the manufacturing method thereof of the embodiment shown in FIG. 9.

What is claimed is:

1. A semiconductor device comprising:
    a semiconductor substrate having a hole penetrating through a thickness thereof, the hole having a first end at a back surface of the substrate and a second end at a front surface of the substrate;
    a first insulation film disposed on the front surface and having an opening overlapping with the hole of the substrate, the opening of the first insulation film being smaller than the second end of the hole;
    a pad electrode for external connection disposed on the first insulation film so as to cover the opening of the first insulation film;
    a second insulation film disposed on a sidewall of the hole of the substrate and the back surface of the substrate; and
    a second wiring disposed in the hole so as to be in contact with the pad electrode, the first insulation film and the second insulation film,
    wherein a part of the second insulation film is disposed so as to bend at a juncture between the sidewall of the hole and the first insulation film so as to extend, in a plane parallel to the first insulation film, along a portion of the first insulation film toward the opening of the first insulation film, and the bending part of the second insulation film is within the second end of the hole of the substrate and placed between the second wiring and the first insulation film so as to form a three-layer vertical stack of the first insulation film, the second insulation film and the second wiring,
    the semiconductor device is configured to be an operable individual die, and
    the hole of the semiconductor device is located at the pad electrode so that the pad electrode closes the second end of the hole in the semiconductor substrate.

2. The semiconductor device of claim 1, wherein a diameter of the opening of the first insulation film is smaller than a diameter of the second end of the hole of the substrate.

3. The semiconductor device of claim 2, wherein the diameter of the second end of the hole of the substrate is smaller than a diameter of the first end of the hole of the substrate.

4. The semiconductor device of claim 1, further comprising a supporting body attached to the front surface of the semiconductor substrate.

5. The semiconductor device of claim 1, wherein the second insulation film comprises a layer of an inorganic material, a layer of an organic material or a combination of a layer of an inorganic material and a layer of an organic material.

6. The semiconductor device of claim 1, further comprising a ball-shaped terminal disposed on the second wiring.

7. The semiconductor device of claim 1, wherein the pad electrode covers the entire opening of the first insulation film in a cross-sectional view of the semiconductor device.

8. The semiconductor device of claim 1, wherein the hole in the semiconductor substrate is of a circular shape.

9. A semiconductor device comprising:
a semiconductor substrate having a hole penetrating through a thickness thereof, the hole having a first end at a back surface of the substrate and a second end at a front surface of the substrate;
a first insulation film disposed on the front surface and having an opening overlapping with the hole of the substrate, the opening of the first insulation film being smaller than the second end of the hole;
a pad electrode for external connection disposed on the first insulation film so as to cover the opening of the first insulation film;
a second insulation film disposed on a sidewall of the hole of the substrate and the back surface of the substrate;
a second wiring disposed in the hole so as to be in contact with the pad electrode, the first insulation film and the second insulation film; and
a protection film made of an insulator and disposed on the second wiring so as to be in the opening of the first insulation film,
wherein a part of the second insulation film is disposed so as to bend at a juncture between the sidewall of the hole and the first insulation film so as to extend along a portion of the first insulation film toward the opening of the first insulation film, and the bending part of the second insulation film is within the second end of the hole of the substrate,
the semiconductor device is configured to be an operable individual die, and
the hole of the semiconductor device is located at the pad electrode so that the pad electrode closes the second end of the hole in the semiconductor substrate.

10. A semiconductor device comprising:
a semiconductor substrate having a hole penetrating through a thickness thereof, the hole having a first end at a back surface of the semiconductor substrate and a second end at a front surface of the semiconductor substrate;
a first insulation film disposed on the front surface and having an opening overlapping with the hole of the semiconductor substrate, the opening of the first insulation film being smaller than the second end of the hole;
a pad electrode for external connection disposed on the first insulation film so as to cover the opening of the first insulation film;
a second insulation film disposed on a sidewall of the hole of the semiconductor substrate and the back surface of the semiconductor substrate;
a second wiring disposed in the hole so as to be in contact with the pad electrode, the first insulation film and the second insulation film;
a substrate made of a glass, ceramic or quartz and disposed on the front surface of the semiconductor substrate;
a resin layer attaching the substrate made of a glass, ceramic or quartz to the front surface of the semiconductor substrate, and
the hole of the semiconductor device is located at the pad electrode so that the pad electrode closes the second end of the hole in the semiconductor substrate.

* * * * *